(12) United States Patent
Jeong

(10) Patent No.: US 9,303,317 B2
(45) Date of Patent: Apr. 5, 2016

(54) DEPOSITION APPARATUS

(71) Applicant: Samsung Display Co., Ltd., Yongin, Gyeonggi-Do (KR)

(72) Inventor: Heung-Cheol Jeong, Hwaseong-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 414 days.

(21) Appl. No.: 13/768,930

(22) Filed: Feb. 15, 2013

(65) Prior Publication Data

US 2014/0033980 A1 Feb. 6, 2014

(30) Foreign Application Priority Data

Aug. 6, 2012 (KR) .......................... 10-2012-0085852

(51) Int. Cl.
| | |
|---|---|
| *C23C 16/00* | (2006.01) |
| *C23C 16/04* | (2006.01) |
| *C23C 14/24* | (2006.01) |
| *C23C 14/04* | (2006.01) |

(52) U.S. Cl.
CPC ............. *C23C 16/042* (2013.01); *C23C 14/042* (2013.01); *C23C 14/24* (2013.01)

(58) Field of Classification Search
CPC ............................... C23C 16/042; C23C 14/24
USPC .................................................. 118/726, 727
See application file for complete search history.

(56) References Cited

U.S. PATENT DOCUMENTS

| | | | | |
|---|---|---|---|---|
| 4,373,470 | A  * | 2/1983 | Martin .......................... | 118/720 |
| 2002/0017245 | A1* | 2/2002 | Tsubaki et al. ............... | 118/718 |
| 2009/0098280 | A1* | 4/2009 | Tahon .............................. | 427/69 |
| 2010/0310768 | A1* | 12/2010 | Lee et al. ................... | 427/255.5 |
| 2013/0059063 | A1* | 3/2013 | Kawato et al. ................. | 427/66 |
| 2013/0293653 | A1* | 11/2013 | Spence et al. ................. | 347/104 |

FOREIGN PATENT DOCUMENTS

| | | | | |
|---|---|---|---|---|
| JP | 2011-114556 | * | 5/2011 | ............. C23C 16/04 |
| JP | WO2011/145456 | * | 11/2011 | ............. C23C 16/04 |
| KR | 10-0751355 | | 8/2007 | |
| KR | 10-2011-0072092 | | 6/2011 | |
| KR | 10-1097311 | | 12/2011 | |
| KR | 10-2012-0007880 | | 1/2012 | |
| KR | 10-1127583 | | 3/2012 | |

\* cited by examiner

*Primary Examiner* — Keath Chen
(74) *Attorney, Agent, or Firm* — Robert E. Bushnell, Esq.

(57) ABSTRACT

A deposition apparatus includes a deposition source unit that has a crucible heating a deposition material filled therein to vaporize the deposition material and a plurality of nozzles spraying the vaporized deposition material, a substrate disposed to face the nozzles, a blind plate disposed between the deposition source unit and the substrate and including a plurality of first openings to guide a traveling direction of the deposition material sprayed from the nozzles, a mask disposed between the substrate and the blind plate and including a plurality of second openings to provide a path through which the deposition material passing through the first openings of the blind plate is deposited on the substrate, and a heater unit that heats the blind plate at a predetermined temperature to vaporize the deposition material stacked up on the blind plate.

22 Claims, 8 Drawing Sheets

DEPOSITION APPARATUS

CLAIM OF PRIORITY

This application makes reference to, incorporates the same herein, and claims all benefits accruing under 35 U.S.C. §119 from an application earlier filed in the Korean Intellectual Property Office on 6 Aug. 2012 and there duly assigned Serial No. 10-2012-0085852.

BACKGROUND OF THE INVENTION

1. Field of the Invention

An embodiment of the present invention relates to a deposition apparatus, and more particularly, to a deposition apparatus capable of reducing a shadow area.

2. Description of the Related Art

In recent, an organic light emitting display device has been spotlighted as a next generation display device since it has superior brightness and viewing angle and does not need to include a separate light source when compared to a liquid crystal display device. Accordingly, the organic light emitting display device has advantages of slimness and lightweight. In addition, the organic light emitting display device has superior properties, e.g., faster response speed, lower driving voltage, higher brightness, etc.

In general, the organic light emitting display device includes an organic light emitting diode including an anode, an organic emitting layer, and a cathode. A hole and an electron are injected into the organic emitting layer respectively through an anode and a cathode, and are recombined in the organic emitting layer to generate an exciton. The exciton emits energy discharged as light when an excited state returns to a ground state.

The anode and the cathode may be formed of a metal thin film or a transparent electrically conductive thin film. The organic emitting layer is configured to include at least one organic thin layer. In order to deposit the organic thin layer or the metal thin layer on a substrate of the organic light emitting display device, a deposition apparatus is generally used. The deposition apparatus includes a crucible filled with a deposition material and a nozzle that sprays the deposition material. When the crucible is heated, the deposition material in the crucible is vaporized and the vaporized deposition material is sprayed through the nozzle. The deposition material sprayed from the nozzle is deposited on the substrate, so that the organic thin layer is formed.

The above information disclosed in this Background section is only for enhancement of understanding of the background of the described technology and therefore it may contain information that does not form the prior art that is already known in this country to a person of ordinary skill in the art.

SUMMARY OF THE INVENTION

An aspect of the present invention provides a deposition apparatus capable of reducing a shadow area.

Embodiments of the present invention provide a deposition apparatus that includes a deposition source unit that has a crucible heating a deposition material filled therein to vaporize the deposition material and a plurality of nozzles spraying the vaporized deposition material, a substrate disposed to face the nozzles, a blind plate disposed between the deposition source unit and the substrate and including a plurality of first openings to guide a traveling direction of the deposition material sprayed from the nozzles, a mask disposed between the substrate and the blind plate and including a plurality of second openings to provide a path through which the deposition material passing through the first openings of the blind plate is deposited on the substrate, and a heater unit that heats the blind plate at a predetermined temperature to vaporize the deposition material stacked up on the blind plate.

An angle between the deposition material sprayed from a nozzle located at a rightmost position of the nozzles and an upper portion of a left boundary of a second opening located at a leftmost position of the second openings and an angle between the deposition material sprayed from a nozzle located at a leftmost position of the nozzles and an upper portion of a right boundary of a second opening located at a rightmost position of the second openings are defined as a first angle. An angle between an upper portion of the right boundary of the first opening located at the leftmost position of the first openings and an upper portion of a left boundary of a second opening located at the leftmost position of the second openings and an angle between an upper portion of the left boundary of the first opening located at the rightmost position of the first openings and an upper portion of a right boundary of the second opening located at the rightmost position of the second openings are defined as a second angle. The second angle is set greater than the first angle.

According to embodiments of the present invention, the first openings are arranged in a matrix form and each of the first openings has a rectangular shape.

According to embodiments of the present invention, each of the first openings has a rectangular shape and is extended in a column direction.

According to embodiments of the present invention, each of the first openings has a triangular shape or a reverse triangular shape, and the first openings having the triangular shape are alternately arranged with the first openings having the reverse triangular shape in a row direction.

According to embodiments of the present invention, each of the first openings has a hexagon shape.

According to embodiments of the present invention, the nozzles are linearly arranged in a line.

According to embodiments of the present invention, the blind plate has a width equal to or smaller than a width of the mask in a left and right direction.

According to embodiments of the present invention, the first openings have a width greater than a width of the second openings.

According to embodiments of the present invention, the width of each of the first openings is in a range of about 30 mm to about 150 mm.

According to embodiments of the present invention, a temperature generated by the heater unit is set higher than a temperature set to vaporize the deposition material filled in the deposition source unit.

According to embodiments of the present invention, the heater unit is attached to an outer side surface of the blind plate and an inner side surface of the blind plate, which defines the first openings.

According to embodiments of the present invention, the heater unit is attached to an entire upper surface of the blind plate.

Embodiments of the present invention provide a deposition apparatus that includes a deposition source unit that has a crucible heating a deposition material filled therein to vaporize the deposition material and a plurality of nozzles spraying the vaporized deposition material, a substrate disposed to face the nozzles, a blind plate disposed between the deposition source unit and the substrate and including a plurality of first openings to guide a traveling direction of the deposition material sprayed from the nozzles, a mask disposed between the substrate and the blind plate and including a plurality of second openings to provide a path through which the deposition material passing through the first openings of the blind plate is deposited on the substrate, and a transfer unit that transfers the blind plate. The nozzles are linearly arranged in a line and the transfer unit transfers the blind plates back and forth along a same direction as the direction in which the nozzles are linearly arranged. In another embodiment, the nozzles may be linearly arranged in a straight line.

The transfer unit includes first supporters respectively attached to two opposite outer surfaces of the blind plate in a direction vertical to the direction in which the nozzles are arranged when viewed in a plan view to support the blind plate, second supporters disposed to be vertical to the first supporters and each attached to a lower surface of a corresponding first supporter of the first supporters, third supporters each attached to a lower surface of a corresponding second supporters of the second supporters, and rail units extended in the same direction as the direction in which the nozzles are linearly arranged while interposing the deposition source unit therebetween and each attached to a lower surface of a corresponding third supporter of the third supporters. Each of the third supporters is transferred back and forth in the same direction as the direction in which the nozzles are linearly arranged on a corresponding rail unit of the rail units.

According to the above, the deposition apparatus may reduce the shadow area and improve the uniformity in thickness of the organic material deposited on the substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
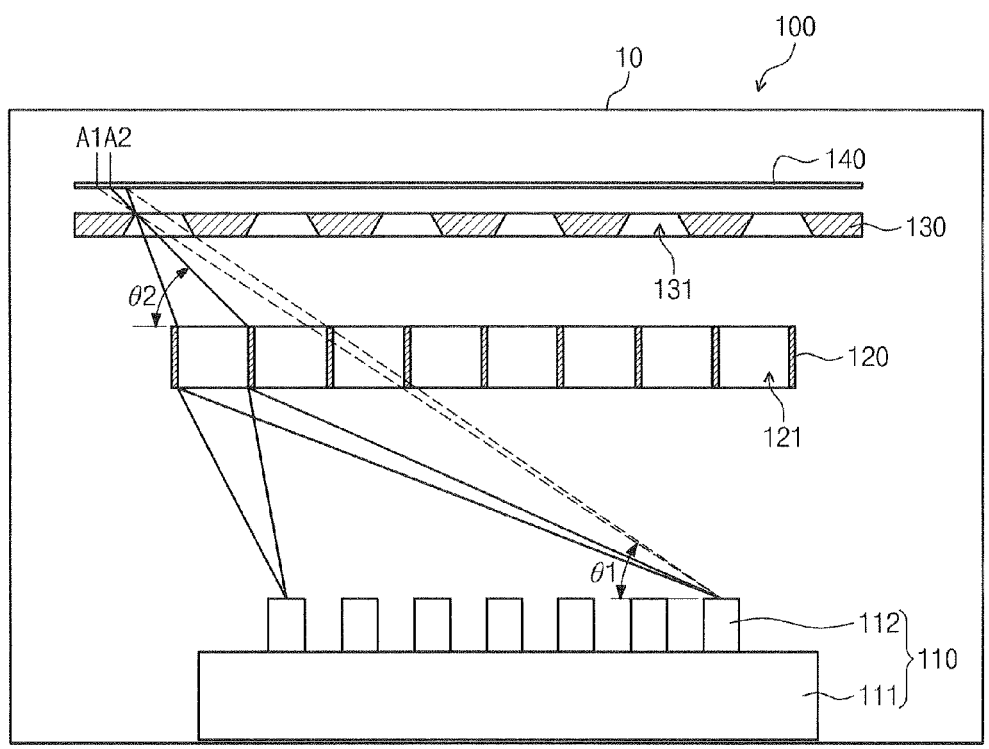
FIG. 1 is a view showing a deposition apparatus constructed with the principle of a first exemplary embodiment of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a view showing a deposition apparatus constructed with the principle of a first exemplary embodiment of the present invention.

Referring to FIG. 1, a deposition apparatus 100 constructed with the principle of the first exemplary embodiment of the present invention includes a vacuum chamber 10, a deposition source unit 110, a blind plate 120, a mask 130, and a substrate 140.

The vacuum chamber 10 maintains a high vacuum state in order to prevent foreign substances from entering the vacuum chamber 10 and to secure straightness of a deposition material. The vacuum chamber 10 maintains the degree of vacuum of about 10E-7 Torr.

The deposition source unit 110 is disposed at a lower portion in the vacuum chamber 10. The deposition material to be deposited on the substrate 140, e.g., an organic material, a metal material, etc., is provided inside the deposition source unit 110. The deposition source unit 110 is configured to vaporize the deposition material.

The deposition source unit 110 includes a crucible 111 filled with the deposition material to be deposited on the substrate 140 and a plurality of nozzles 112 that spray the deposition material vaporized in the crucible 111. The nozzles 112 are disposed on an upper surface of the deposition source unit 110 and spaced apart from each other at regular intervals. As shown in FIG. 1, the nozzles 112 are linearly arranged in left-and-right direction. In this case, the deposition source unit 110 may be referred to as a linear deposition source. Although not shown in FIG. 1, each of the nozzles 112 is provided with a hole formed therethrough to spray the vaporized organic material contained in the deposition source unit 110. In addition, although not shown in FIG. 1, the deposition source unit 110 may include a heater (not shown) disposed in the crucible 111 to vaporize the deposition material filled in the crucible 111.

The substrate 140 is disposed at an upper portion in the vacuum chamber 10 to face the nozzles 112. When the deposition material to be deposited on the substrate 140 is the organic material, an organic thin layer is formed on the substrate 140. Hereinafter, the organic material will be described as the deposition material, but the deposition material should not be limited to the organic material. For example, the metal material may be used as the deposition material.

The blind plate 120 is disposed between the deposition source unit 110 and the substrate 140. The blind plate 120 includes a plurality of first openings 121 to guide a traveling direction of the organic material sprayed from the nozzles 112. The organic material sprayed from the nozzles 112 passes through the first openings 121, and thus the organic material travels to a direction guided by the first openings 121.

The mask 130 is disposed between the substrate 140 and the blind plate 120. In detail, the mask 130 is located at a position adjacent to the substrate 140 while interposing a predetermined distance therebetween. The mask 130 includes a plurality of second openings 131 formed therethrough so as to provide paths through which the organic material passing through the first openings 121 of the blind plate 120 is deposited on the substrate 140. The mask 130 is prepared to have the same size as that of the substrate 140. The second openings 131 of the mask 130 correspond to sub-pixel areas formed on the substrate 140, respectively. The mask 130 may be a fine metal mask (FMM).

The organic material is deposited on the substrate 140 after passing through the second openings 131 of the mask 130. That is, the organic material sprayed from the nozzles 112 sequentially passes through the first openings 121 of the blind plate 120 and the second openings 131 of the mask 130, and is then deposited on the substrate 140.

The blind plate 120 has a width equal to or smaller than that of the mask 130 in a left and right direction. In addition, the first openings 121 of the blind plate 120 have a width greater than that of the second openings 131 of the mask 130. Further, the width of each of the first openings 121 may be in a range of about 30 mm to about 150 mm.

The deposition apparatus 100 further includes a substrate supporter (not shown) disposed in the vacuum chamber 10 to support an edge portion of the substrate 140. The substrate 140 is a substrate for an organic electroluminescence display device, but it should not be limited thereto or thereby.

In the organic material provided on the substrate 140 from the deposition source unit 110, the organic material not vertically incident to the second openings 131 of the mask 130 is deposited on the substrate 140. The area on the substrate 140, in which the organic material not vertically incident to the second openings 131 of the mask 130 is deposited, is referred to as a shadow area (or a shadow phenomenon).

As shown in FIG. 1, the organic material sprayed from the nozzle 112 located at a rightmost position of the nozzles 112 to the second opening 131 located at a leftmost position of the second openings 131 of the mask 130 has been indicated by dotted lines in case where the blind plate 120 does not exist. In case where the blind plate 120 does not exist, when the organic material sprayed from the nozzle 112 located at the rightmost position of the nozzles 112 passes through the second opening 131 located at the leftmost position of the second openings 131 of the mask 130, the organic material is deposited to a first boundary area A1.

In the case that the shadow area is increased, unnecessary area of the substrate 140, in which the organic material is deposited, is increased. In this case, the organic material having fine line width is not formed and a display panel having high resolution is difficult to be manufactured. Accordingly, it is important to reduce the shadow area.

The deposition apparatus 100 constructed with the principle of the present exemplary embodiment of the present invention includes the blind plate 120 to restrict an incident angle of the organic material traveling to the substrate 140. In detail, an angle between the organic material sprayed from the nozzle 112 located at the rightmost position of the nozzles 112 and an upper portion of a left boundary of the second opening 131 located at the leftmost position of the second openings 131 of the mask 130 may be a first angle $\theta 1$. In addition, although not shown in figures, an angle between the organic material sprayed from the nozzle 112 located at a leftmost position of the nozzles 112 and an upper portion a right boundary of the second opening 131 located at a rightmost position of the second openings 131 of the mask 130 may be the first angle $\theta 1$.

An angle between an upper portion of the right boundary of the first opening 121 located at the leftmost position of the blind plate 120 and an upper portion of the left boundary of the second opening 131 located at the leftmost position of the mask 130 may be a second angle $\theta 2$. In addition, although not shown in figures, an angle between an upper portion of the left boundary of the first opening 121 located at the rightmost position of the blind plate 120 and an upper portion of the right boundary of the second opening 131 located at the rightmost position of the mask 130 may be the second angle $\theta 2$. The first angle $\theta 1$ and the second angle $\theta 2$ are set with reference to parallel lines, and the second angle $\theta 2$ is set greater than the first angle $\theta 1$.

Among the nozzles 112, the incident angle when the organic material sprayed from the nozzle 112 located at the rightmost position is incident to a leftmost portion of the substrate 140 or the incident angle when the organic material sprayed from the nozzle 112 located at the leftmost position is incident to a rightmost portion of the substrate 140 is a minimum incident angle of the organic material.

When it is assumed that the blind plate 120 does not exist, the minimum incident angle of the organic material sprayed from the nozzle 112 located at the rightmost position may be set to the first angle $\theta 1$. Accordingly, the organic material sprayed from the nozzle 112 located at the rightmost position is provided to the leftmost portion of the substrate 140 as shown by the dotted lines of FIG. 1. That is, the organic material is deposited to the first boundary area A1 when the blind plate 120 does not exist. When the size of the substrate 140 is increased, the size of the deposition source unit 110 is increased and the number of the nozzles 112 is increased. In this case, the minimum incident angle becomes smaller and the shadow area is widened.

When the blind plate 120 exists according to the principle of the present invention, however, the organic material sprayed from the nozzle 112 located at the rightmost position travels to the leftmost portion of the substrate 140 at the second angle θ2 via the blind plate 120. That is, the minimum incident angle of the organic material sprayed from the nozzle 112 located at the rightmost position may be set to the second angle θ2. Accordingly, the organic material sprayed from the nozzle 112 located at the rightmost position is provided to a second boundary area A2 of the substrate 140 as shown by solid lines of FIG. 1. Therefore, the shadow area may be reduced to the second boundary area A2 from the first boundary area A1 by the blind plate 120. The organic material sprayed from the nozzle 112 located at the leftmost position may travel to the rightmost portion of the substrate 140 at the second angle θ2 by the blind plate 120.

Consequently, the shadow area in the deposition apparatus 100 constructed with the principle of the present exemplary embodiment may be reduced by the blind plate 120.

In another embodiment, the first angle θ1 may refer to an acute angle between a horizontal line and a straight line connecting the right boundary of the hole of the rightmost nozzle 112 and the upper portion of the left boundary of the leftmost second opening 131; the first angle θ1 may refer to an acute angle between a horizontal line and a straight line connecting the left boundary of the hole of the leftmost nozzle 112 and the upper portion of the right boundary of the rightmost second opening 131.

In another embodiment, the second angle θ2 may refer to an acute angle between a horizontal line and a straight line connecting the upper portion of the right boundary of the leftmost first opening 121 and the upper portion of the left boundary of the leftmost second opening 131; the second angle θ2 may refer to an acute angle between a horizontal line and a straight line connecting the upper portion of the left boundary of the rightmost first opening 121 and the upper portion of the right boundary of the rightmost second opening 131.

FIGS. 2A through 2D are plan views showing various shapes of openings of the blind plate 120 shown in FIG. 1.

In reference to FIGS. 2A through 2D, the first openings 121 of the blind plate 120 may have various shapes as long as the blind plate 120 restricts the second angle θ2.

Figure 2A:
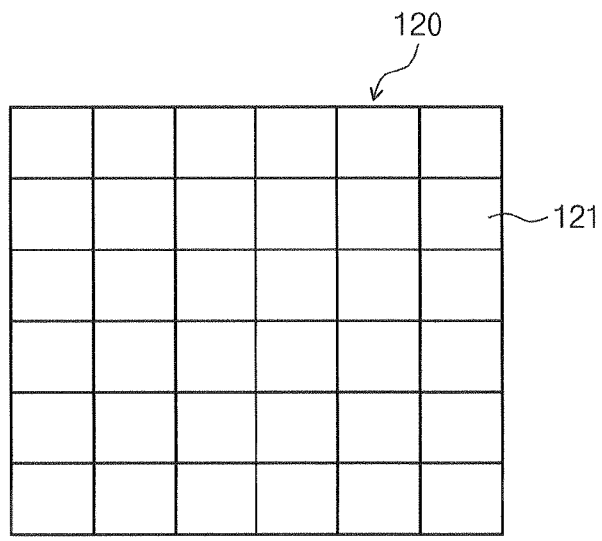
FIGS. 2A through 2D are plan views showing various shapes of openings of a blind plate shown in FIG. 1.

As shown in FIG. 2A, the first openings 121 of the blind plate 120 are arranged in a matrix form and each of the first openings 121 of the blind plate 120 has a rectangular shape.

Figure 2B:
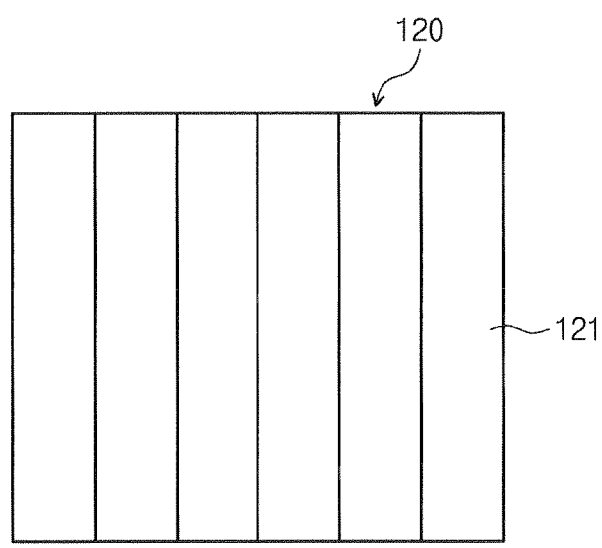

As shown in FIG. 2B, each of the first openings 121 of the blind plate 120 has the rectangular shape and is extended in a column direction. The blind plate 120 that includes the first openings 121 having the rectangular shape and being arranged in the matrix form or the first openings 121 having the rectangular shape and being extended in the column direction may be used to form pixels each having a rectangular shape.

Figure 2C:
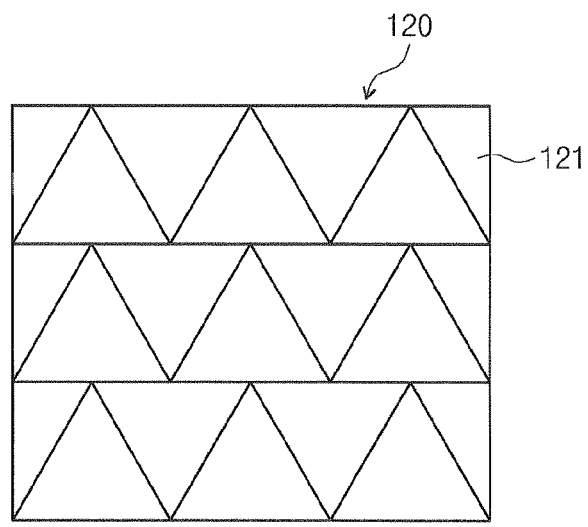

In reference to FIG. 2C, the first openings 121 of the blind plate 120 has a triangular shape and a reverse triangular shape, and the first openings 121 having the triangular shape are alternately arranged with the first openings 121 having the reverse triangular shape in a row direction. That is, each of the first openings 121 having the triangular shape is disposed adjacent to the first openings 121 having the reverse triangular shape in the row direction. The triangular shape has a left and right width that becomes narrower as it goes toward the upper portion thereof, and the reverse triangular shape has a left and right width that narrower as it goes toward the lower portion thereof. As the left and right width becomes narrower, the second angle becomes larger, and the second angle becomes smaller as the left and right width become wider. As described above, since the first openings 121 having the triangular shape are alternately arranged with the first openings 121 having the reverse triangular shape, the second angle may be of various sizes.

Figure 2D:
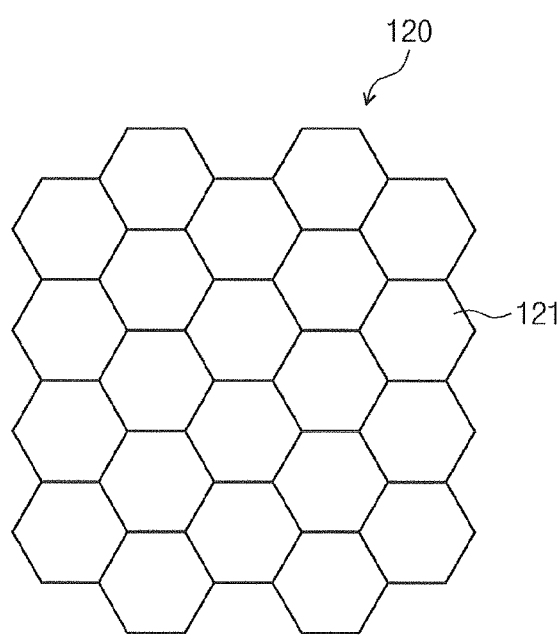

As shown in FIG. 2D, the first openings 121 of the blind plate 120 are disposed adjacent to each other and each of the first openings 121 of the blind plate 120 has a hexagon shape. Thus, pixels each having the hexagon shape may be formed on the substrate 140. In this case, the second openings 131 of the mask 130 have the hexagon shape. The first openings 121 of the blind plate 120 may be used to form the pixels in the hexagon shape.

Figure 3:
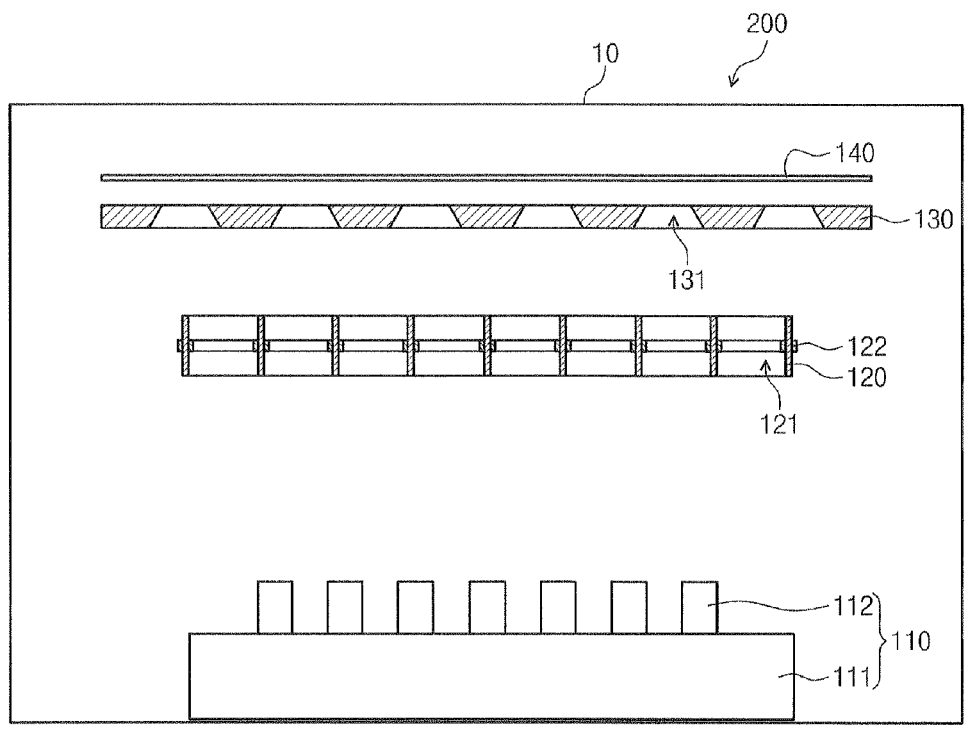
FIG. 3 is view showing a deposition apparatus constructed with the principle of a second exemplary embodiment of the present invention.
Figure 4A:
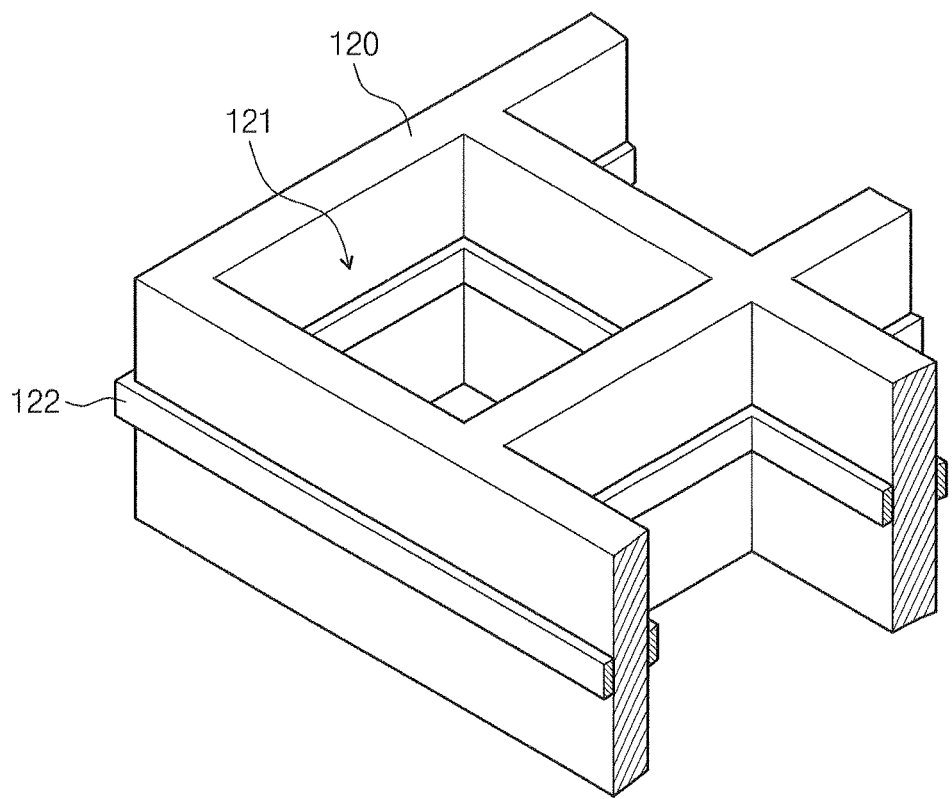
FIG. 4A is an oblique view showing a heater unit shown in FIG. 3 according to an exemplary embodiment of the present invention.

FIG. 3 is view showing a deposition apparatus constructed with the principle of a second exemplary embodiment of the present invention and FIG. 4A is an oblique view showing a heater unit shown in FIG. 3 constructed with the principle of an exemplary embodiment of the present invention.

The deposition apparatus 200 shown in FIG. 3 has the same configuration and function as those of the deposition apparatus 100 shown in FIG. 1 except that the deposition apparatus 200 includes the heater unit 122. Accordingly, in FIG. 3, the same reference numerals denote the same elements in FIG. 1, and thus detailed descriptions of the same elements will be omitted.

In reference to FIGS. 3 and 4A, the deposition apparatus 200 constructed with the principle of the second exemplary embodiment of the present invention includes the heater unit 122 attached to the blind plate 120. The heater unit 122 may be formed on an outer side surface of the blind plate 120 and an inner side surface, which defines the first openings 121, of the blind plate 120.

The organic material sprayed from the nozzles 112 passes through the first openings 121 of the blind plate 120. The organic material is stacked up on a lower surface of the blind plate 120, the inner side surface of the blind plate 120, which is formed by the first openings 121, an upper surface of the blind plate 120, and the outer side surface of the blind plate 120.

When the organic material is stacked up on the blind plate 120, reliability of the second angle θ2 is lowered. That is, due to the organic material stacked up on the inner side surface of the blind plate 120, which is defined by the first openings 121, the width of the first openings 121 becomes narrower. In addition, the second angle θ2 is deformed to a different angle from the predetermined angle by the organic material stacked up on the upper surface of the blind plate 120.

The heater unit 122 heats the blind plate 120 at a predetermined temperature to vaporize the organic material stacked up on the blind plate 120. In order to effectively vaporize the organic material stacked up on the blind plate 120, the temperature generated by the heater unit 122 may be set higher than the temperature set to vaporize the organic material filled in the deposition source unit 110.

Consequently, the deposition apparatus 200 may vaporize the organic material stacked up on the blind plate 120 while reducing the shadow area.

Figure 4B:
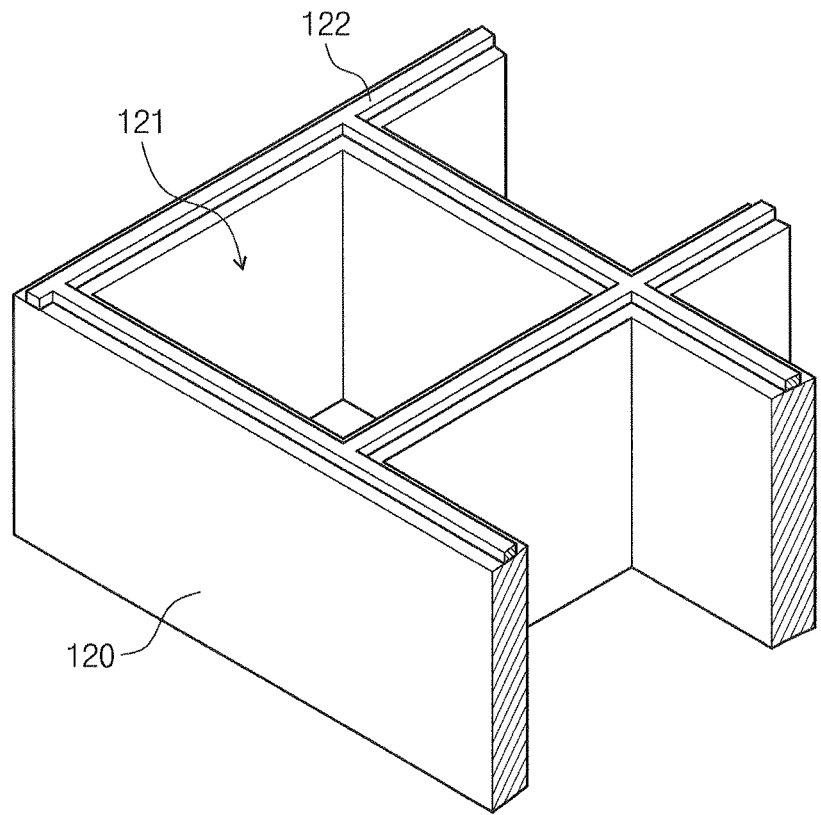
FIG. 4B is an oblique view showing a heater unit shown in FIG. 3 constructed with the principle of another exemplary embodiment of the present invention.

FIG. 4B is an oblique view showing a heater unit shown in FIG. 3 according to another exemplary embodiment of the present invention.

As shown in FIG. 4B, the heater unit 122 is formed on the entire upper surface of the blind plate 120.

Figure 5:
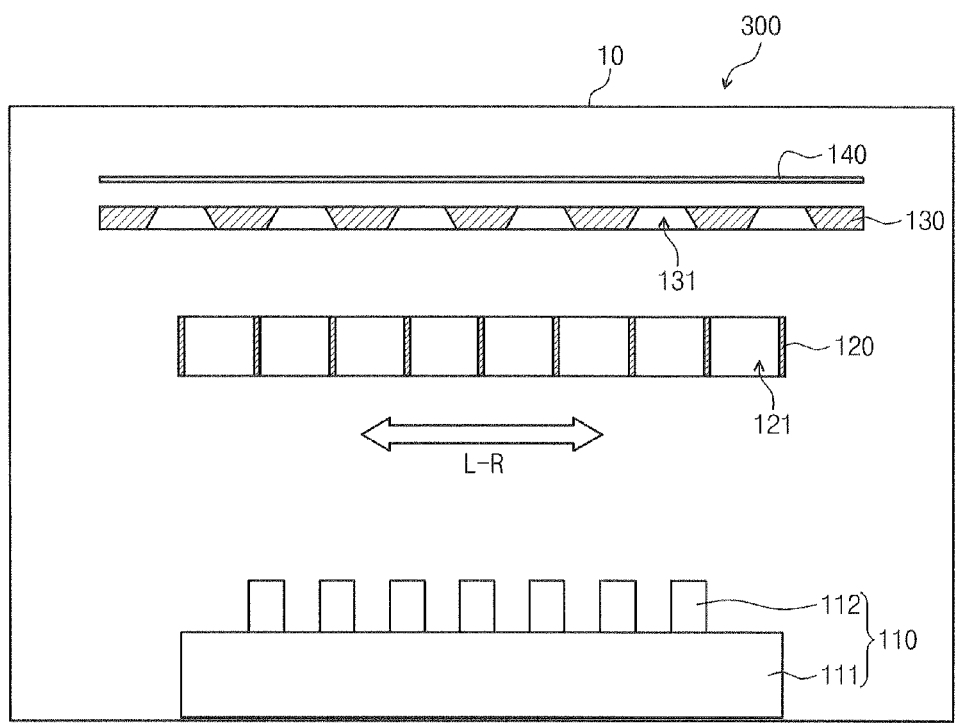
FIG. 5 is a view showing a deposition apparatus constructed with the principle of a third exemplary embodiment of the present invention.

FIG. 5 is a view showing a deposition apparatus constructed with the principle of a third exemplary embodiment of the present invention.

The deposition apparatus 300 shown in FIG. 5 has the same configuration and function as those of the deposition apparatus 100 shown in FIG. 1 except that the deposition apparatus 300 includes a transfer unit 150. In FIG. 5, the same reference numerals denote the same elements in FIG. 1, and thus detailed descriptions of the same elements will be omitted.

In reference to FIG. 5, the deposition source unit 110 is configured to have the configuration of the linear deposition source. That is, the nozzles 112 are linearly arranged in left-and-right direction. The blind plate 120 is transferred back and forth along the same direction as the direction in which the nozzles 112 are arranged. For instance, when the nozzles 112 are linearly arranged in left-and-right direction L-R, the blind plate 120 may be transferred back and forth in the left-and-right direction L-R.

The organic material sprayed from the nozzles 112 has non-uniform density, which is caused by non-uniform temperature in the crucible 111 or difference in size of the nozzles 112. In the case that the blind plate 120 is held in a fixed position, although the organic material travels to the substrate 140 at the uniform angle after passing through the first openings 121 and the second openings 131, uniformity of the organic material deposited on the substrate 140 is lowered since the density of the organic material sprayed from the nozzles 122 is non-uniform.

When the blind plate 120 is transferred back and forth in the left-and-right direction, however, the organic material travels to the substrate 140 at various angles and then is deposited on the substrate 140. Although the density of the organic material sprayed from the nozzles 112 is not uniform, the uniformity in thickness of the organic material deposited on the substrate 140 may be improved since the organic material is repeatedly deposited on the substrate 140 at various angles when compared to the uniformity in thickness of the organic material deposited on the substrate 140 at a fixed angle.

Consequently, the deposition apparatus 300 constructed with the principle of the third exemplary embodiment of the present invention may reduce the shadow area and improve the uniformity in thickness of the organic material deposited on the substrate 140.

Figure 6:
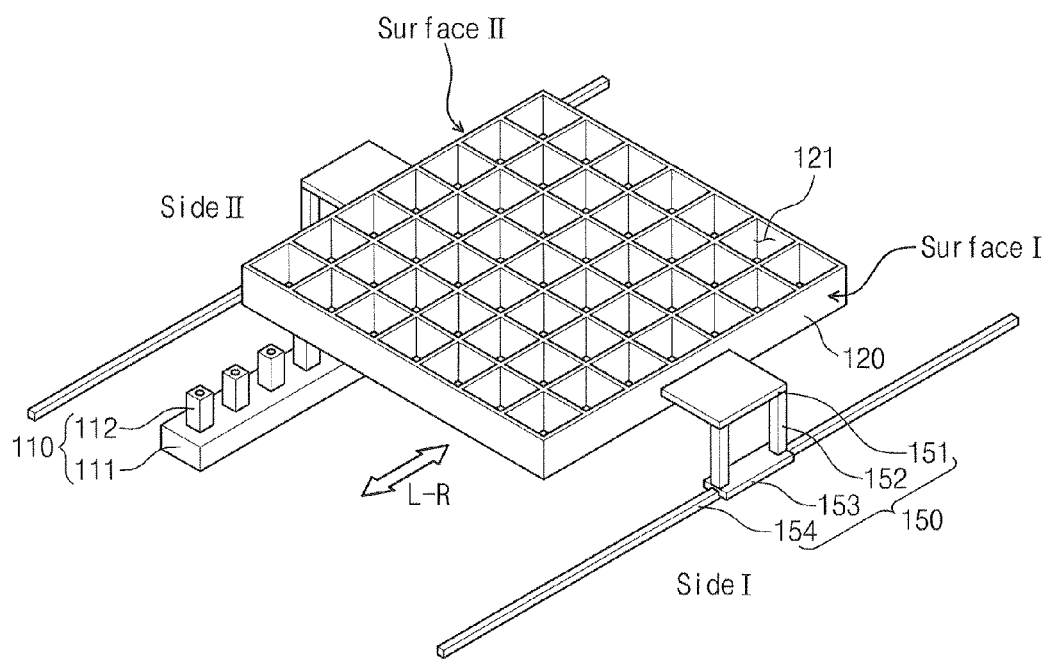
FIG. 6 is an oblique view showing a transfer unit used to transfer a blind plate shown in FIG. 5.

FIG. 6 is an oblique view showing the transfer unit used to transfer a blind plate shown in FIG. 5. In FIG. 6, the blind plate 120 shown in FIG. 2A has been shown as an example.

In reference to FIG. 6, the deposition apparatus 300 includes the transfer unit 150 to transfer the blind plate 120. The transfer unit 150 includes two first supporters 151, four second supporters 152, two third supporters 153, and two rail units 154.

When viewed in a plan view, the first supporters 151 are respectively attached to two opposite outer surfaces (Surface I, Surface II) of the blind plate 120 in a direction vertical to the direction L-R in which the nozzles 112 are arranged so as to support the blind plate 120.

The second supporters 152 are disposed to be vertical to the first supporters 151 and attached to a lower surface of a corresponding first supporter of the first supporters 151. In detail, two second supporters 152 are attached to the lower surface of the first supporter 151 located at Side I of the blind plate 120 while being disposed to be vertical to the first supporters 151. The other two second supporters 152 are attached to the lower surface of the first supporter 151 located at Side II of the blind plate 120 while being disposed to be vertical to the first supporters 151.

The third supporters 153 are attached to lower surfaces of corresponding second supporters of the second supporters 152. In more detail, the third supporters 153 are respectively attached to the lower surfaces of the second supporters 152 attached to the lower surface of the first supporter 151 disposed at Side I of the blind plate 120 and to the lower surfaces of the second supporters 152 attached to the lower surface of the first supporter 151 disposed at Side II of the blind plate 120.

The third supporters 153 are coupled to the rail units 154, respectively, and transferred back and forth in the same direction L-R as the direction in which the nozzles 112 are linearly arranged in a line. In detail, the third supporter 153 disposed at Side II of the blind plate 120 makes physical contact with the rail unit 154 disposed at Side II of the blind plate 120, and the third supporter 153 disposed at Side I of the blind plate 120 makes physical contact with the rail unit 154 disposed at Side I of the blind plate 120.

The rail units 154 are extended in the same direction as the direction in which the nozzles 112 are linearly arranged in a line while interposing the deposition source unit 110 therebetween. Although not shown in figures, a driving unit is coupled to the transfer unit 150 to drive the transfer unit 150. Thus, each of the third supporters 153 may be transferred back and forth in the same direction as the direction in which the nozzles 112 are linearly arranged in a line on the corresponding rail unit of the rail units 154 by the driving unit.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A deposition apparatus, comprising:
a deposition source unit that includes a crucible and a plurality of nozzles, the crucible heating a deposition material filled therein to vaporize the deposition material and the nozzles spraying the vaporized deposition material;
a substrate disposed to face the nozzles;
a blind plate disposed between the deposition source unit and the substrate, the blind plate including a plurality of first openings to guide a traveling direction of the deposition material sprayed from the nozzles, the blind plate including a plurality of first side walls extended in a row direction and a plurality of second side walls extended in a column direction, a plurality of first openings arranged in a matrix form and defined by the plurality of first and second side walls;
a mask disposed between the substrate and the blind plate, the mask including a plurality of second openings to provide a path through which the deposition material passing through the first openings of the blind plate is deposited on the substrate; and
a heater unit that heats the blind plate at a predetermined temperature to vaporize the deposition material stacked up on the blind plate,
wherein the heater unit is disposed on two opposite major surfaces of each first side wall and two opposite major surfaces of each second side wall defining each first opening.

2. The deposition apparatus of claim 1, wherein an angle between the deposition material sprayed from a nozzle located at a rightmost position of the nozzles and an upper portion of a left boundary of a second opening located at a leftmost position of the second openings and an angle between the deposition material sprayed from a nozzle located at a leftmost position of the nozzles and an upper portion of a right boundary of a second opening located at a rightmost position of the second openings are defined as a first angle, an angle between an upper portion of the right boundary of the first opening located at the leftmost position of the first openings and an upper portion of a left boundary of a second opening located at the leftmost position of the second openings and an angle between an upper portion of the left boundary of the first opening located at the rightmost position of the first openings and an upper portion of a right boundary of the second opening located at the rightmost position of the second openings are defined as a second angle, and the second angle is set greater than the first angle.

3. The deposition apparatus of claim 1, wherein the first openings are arranged in the matrix form and each of the first openings has a rectangular shape.

4. The deposition apparatus of claim 1, wherein each of the first openings has a rectangular shape and is extended in the column direction.

5. The deposition apparatus of claim 1, wherein each of the first openings has a triangular shape or a reverse triangular shape, and the first openings having the triangular shape are alternately arranged with the first openings having the reverse triangular shape in the row direction.

6. The deposition apparatus of claim 1, wherein each of the first openings has a hexagon shape.

7. The deposition apparatus of claim 1, wherein the nozzles are linearly arranged in a line.

8. The deposition apparatus of claim 1, wherein the mask extends farther than the blind plate in a left and right direction.

9. The deposition apparatus of claim 8, wherein the first openings have a width greater than a width of the second openings.

10. The deposition apparatus of claim 9, wherein the width of each of the first openings is in a range of about 30 mm to about 150 mm.

11. The deposition apparatus of claim 1, wherein a temperature generated by the heater unit is set higher than a temperature set to vaporize the deposition material filled in the deposition source unit.

12. A deposition apparatus, comprising:
a deposition source unit that includes a crucible and a plurality of nozzles, the crucible heating a deposition material filled therein to vaporize the deposition material and the nozzles spraying the vaporized deposition material;
a substrate disposed to face the nozzles;
a blind plate disposed between the deposition source unit and the substrate, the blind plate including a plurality of first openings to guide a traveling direction of the deposition material sprayed from the nozzles;
a mask disposed between the substrate and the blind plate, the mask including a plurality of second openings to provide a path through which the deposition material passing through the first openings of the blind plate is deposited on the substrate; and
a heater unit that heats the blind plate at a predetermined temperature to vaporize the deposition material stacked up on the blind plate,
wherein the heater unit is disposed on an entire upper surface of the blind plate.

13. The deposition apparatus of claim 12, wherein an angle between the deposition material sprayed from a nozzle located at a rightmost position of the nozzles and an upper portion of a left boundary of a second opening located at a leftmost position of the second openings and an angle between the deposition material sprayed from a nozzle located at a leftmost position of the nozzles and an upper portion of a right boundary of a second opening located at a rightmost position of the second openings are defined as a first angle, an angle between an upper portion of the right boundary of the first opening located at the leftmost position of the first openings and an upper portion of a left boundary of a second opening located at the leftmost position of the second openings and an angle between an upper portion of the left boundary of the first opening located at the rightmost position of the first openings and an upper portion of a right boundary of the second opening located at the rightmost position of the second openings are defined as a second angle, and the second angle is set greater than the first angle.

14. The deposition apparatus of claim 12, wherein the first openings are arranged in a matrix form and each of the first openings has a rectangular shape.

15. The deposition apparatus of claim 12, wherein each of the first openings has a rectangular shape and is extended in a column direction.

16. The deposition apparatus of claim 12, wherein each of the first openings has a triangular shape or a reverse triangular shape, and the first openings having the triangular shape are alternately arranged with the first openings having the reverse triangular shape in a row direction.

17. The deposition apparatus of claim 12, wherein each of the first openings has a hexagon shape.

18. The deposition apparatus of claim 12, wherein the nozzles are linearly arranged in a line.

19. The deposition apparatus of claim 12, wherein the mask extends farther than the blind plate in a left and right direction.

20. The deposition apparatus of claim 19, wherein the first openings have a width greater than a width of the second openings.

21. The deposition apparatus of claim 20, wherein the width of each of the first openings is in a range of about 30 mm to about 150 mm.

22. The deposition apparatus of claim 12, wherein a temperature generated by the heater unit is set higher than a temperature set to vaporize the deposition material filled in the deposition source unit.

* * * * *